US012593437B2

(12) United States Patent
Jhan et al.

(10) Patent No.: US 12,593,437 B2
(45) Date of Patent: Mar. 31, 2026

(54) SEMICONDUCTOR STRUCTURE AND METHOD FOR FORMING THE SAME

(71) Applicant: Fujian Jinhua Integrated Circuit Co., Ltd., Quanzhou City (CN)

(72) Inventors: Yi-Wang Jhan, Taichung City (TW); Fu-Che Lee, Taichung City (TW); Gang-Yi Lin, Taitung County (TW); An-Chi Liu, Tainan City (TW); Yifei Yan, Jinjiang City (CN); Yu-Cheng Tung, Kaohsiung City (TW)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 0 days.

(21) Appl. No.: 17/378,789

(22) Filed: Jul. 19, 2021

(65) Prior Publication Data

US 2022/0415895 A1     Dec. 29, 2022

(30) Foreign Application Priority Data

Jun. 23, 2021    (CN) .......................... 202110697564.5
Jun. 23, 2021    (CN) .......................... 202121406525.7

(51) Int. Cl.
H10B 12/00       (2023.01)
H10D 64/01       (2025.01)
               (Continued)

(52) U.S. Cl.
CPC ............. H10B 12/30 (2023.02); H10B 12/02 (2023.02); H10B 12/50 (2023.02)

(58) Field of Classification Search
CPC ........ H10B 12/30; H10B 12/50; H10B 12/48; H10B 12/482; H10B 12/185; H10B 12/188; H01L 27/10805; H01L 27/10897; H01L 27/085; H01L 27/088; H01L 27/10882; H01L 27/10885; H01L 27/10888; H01L 27/10891; H01L 29/4958; H01L 29/6656; H01L 29/66553; H01L 29/6653; H01L 29/4983; H01L 29/42344; H01L 29/42328; H01L 29/41725; H01L 29/41775;
(Continued)

(56) References Cited

U.S. PATENT DOCUMENTS 5,541,434 A * 7/1996 Nicholls ........... H01L 21/76877
                                                       257/E21.59
10,141,200 B2    11/2018 Byun
(Continued)

OTHER PUBLICATIONS

Jhan, the specification, including the claims, and drawings in the U.S. Appl. No. 17/378,787 , Filing Date: Jul. 19, 2021.
(Continued)

*Primary Examiner* — Monica D Harrison
*Assistant Examiner* — John Lin
(74) *Attorney, Agent, or Firm* — Winston Hsu

(57) ABSTRACT

A semiconductor structure includes a substrate, a contact structure disposed on the substrate, and two first gate structures disposed on the substrate and at two sides of the first contact structure. The contact structure has a T-shaped cross-sectional profile having a first portion contacting the substrate and a second portion disposed on the first portion. A top surface of the second portion of the contact structure is flush with top surfaces of the two first gate structures.

7 Claims, 10 Drawing Sheets

(51) Int. Cl.

| | |
|---|---|
| *H10D 64/23* | (2025.01) |
| *H10D 64/27* | (2025.01) |
| *H10D 64/66* | (2025.01) |

(58) Field of Classification Search

CPC ....... H01L 29/41783; H01L 29/42372–42376; H01L 21/76897; H10D 64/666; H10D 64/015; H10D 64/018; H10D 64/021; H10D 64/671; H10D 64/675; H10D 64/251; H10D 64/258; H10D 64/259; H10D 64/517; H10D 64/518; H10D 84/82; H10D 84/83–839; H10D 30/6892; H10D 30/696

See application file for complete search history.

(56) References Cited

U.S. PATENT DOCUMENTS

| | | | |
|---|---|---|---|
| 2002/0060334 | A1 | 5/2002 | Shukuri |
| 2002/0149044 | A1 | 10/2002 | Nakanishi |
| 2004/0209429 | A1 * | 10/2004 | Lin ..................... H10B 12/485 |
| | | | 257/E21.507 |
| 2007/0037341 | A1 | 2/2007 | Rueger |
| 2007/0087538 | A1 * | 4/2007 | Kim ...................... H10B 41/35 |
| | | | 257/E21.507 |
| 2007/0278559 | A1 * | 12/2007 | Saito ................... H01L 27/0207 |
| | | | 257/315 |
| 2013/0256769 | A1 * | 10/2013 | Jeong ..................... H10B 12/31 |
| | | | 257/296 |
| 2014/0353734 | A1 * | 12/2014 | Xie .................... H10D 84/0133 |
| | | | 257/288 |
| 2018/0012775 | A1 | 1/2018 | Byun |
| 2018/0226410 | A1 | 8/2018 | Chang |
| 2018/0315759 | A1 | 11/2018 | Liao |
| 2019/0311947 | A1 | 10/2019 | Tapily |
| 2022/0085025 | A1 | 3/2022 | Lim |

OTHER PUBLICATIONS

Jhan, the specification, including the claims, and drawings in the U.S. Appl. No. 18/396,747 , Filing Date: Dec. 27, 2023.

\* cited by examiner

SEMICONDUCTOR STRUCTURE AND METHOD FOR FORMING THE SAME

BACKGROUND OF THE INVENTION

1. Field of the Invention

The present invention relates to a semiconductor structure and method for forming the same. More particularly, the present invention relates to a dynamic random access memory (DRAM) including a memory region and a peripheral region.

2. Description of the Prior Art

Dynamic random access memory (DRAM) is one kind of volatile memory. A DRAM device usually includes a memory region comprising an array of memory cells and a peripheral region comprising control circuits for controlling and/or repairing the memory cells in the memory region. The control circuits in the peripheral region may address each of the memory cells in the memory region by plural columns of word lines and plural rows of bit lines traversing the memory region and electrically connected to each of the memory cells to perform reading, writing or erasing data. In advanced semiconductor manufacturing, the chip size of a DRAM device may be dramatically scaled down by adopting buried word-line or buried bit-lines architectures, by which the active areas of the memory cells may be arranged at a dense pitch for higher cell density.

A dynamic random access memory usually includes a memory region comprising memory cells and a peripheral region comprising peripheral circuits for controlling and/or repairing the memory cells in the memory region. The memory cells and the semiconductor devices of the peripheral circuits are formed integrally through a same manufacturing process. Therefore, it is important to provide peripheral semiconductor devices which are compliable with the manufacturing process of the memory cells.

SUMMARY OF THE INVENTION

It is one objective of the present invention to provide a semiconductor structure and a method for forming the same, wherein the semiconductor structure has a memory region and a peripheral region, and the peripheral region of the semiconductor structure includes a share contact structure form by a same manufacturing process for forming the storage node contacts of the memory cells in the memory region. The share contact structure provided by the present invention may be used to electrically connect two gate structure and a shared source/drain region between the two gate structures. For example, the share contact structure may be used in a fuse circuit in the peripheral region 10A for repairing defective memory cells in the memory region 10B.

According to one embodiment of the present invention, a semiconductor structure is provided. The semiconductor structure includes a substrate, a first contact structure disposed on the substrate, and two first gate structures disposed on the substrate and at two sides of the first contact structure. The first contact structure has a T-shaped cross-sectional profile having a first portion contacting the substrate and a second portion disposed on the first portion. A top surface of the second portion of the first contact structure is flush with top surfaces of the two first gate structures.

According to another embodiment of the present invention, a semiconductor structure is provided. The semiconductor structure includes a substrate, a first contact structure disposed on the substrate and having a T-shaped cross-sectional profile, two first gate structures disposed on the substrate at two sides of the first contact structure, and an outer spacer disposed on an outer side of each of the two first gate structures away from the first contact structure. The two first gate structures respectively comprise an electrode portion and a hard mask portion on the electrode portion, and the first contact structure directly contacts the electrode portions of the two first gate structures.

According to still another embodiment of the present invention, a method for forming a semiconductor structure is provided and includes the steps of providing a substrate having a peripheral region and a memory region defined thereon, forming two first gate structures on the peripheral region of the substrate, forming a first dielectric layer on the substrate and surrounding the two first gate structures, forming a second dielectric layer on the first dielectric layer and covering the two first gate structures, performing a contact etching process to etch the second dielectric layer and the first dielectric layer to form a first contact opening between the two first gate structures, wherein the first contact opening has a T-shaped cross-sectional profile and exposes a portion of the substrate, forming a conductive layer on the second dielectric layer and filling the first contact opening, and performing a recessing process to etch the conductive layer and the second dielectric layer until top surfaces of the two first gate structures are exposed, thereby forming a first contact structure in the first contact opening.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Figure 1:
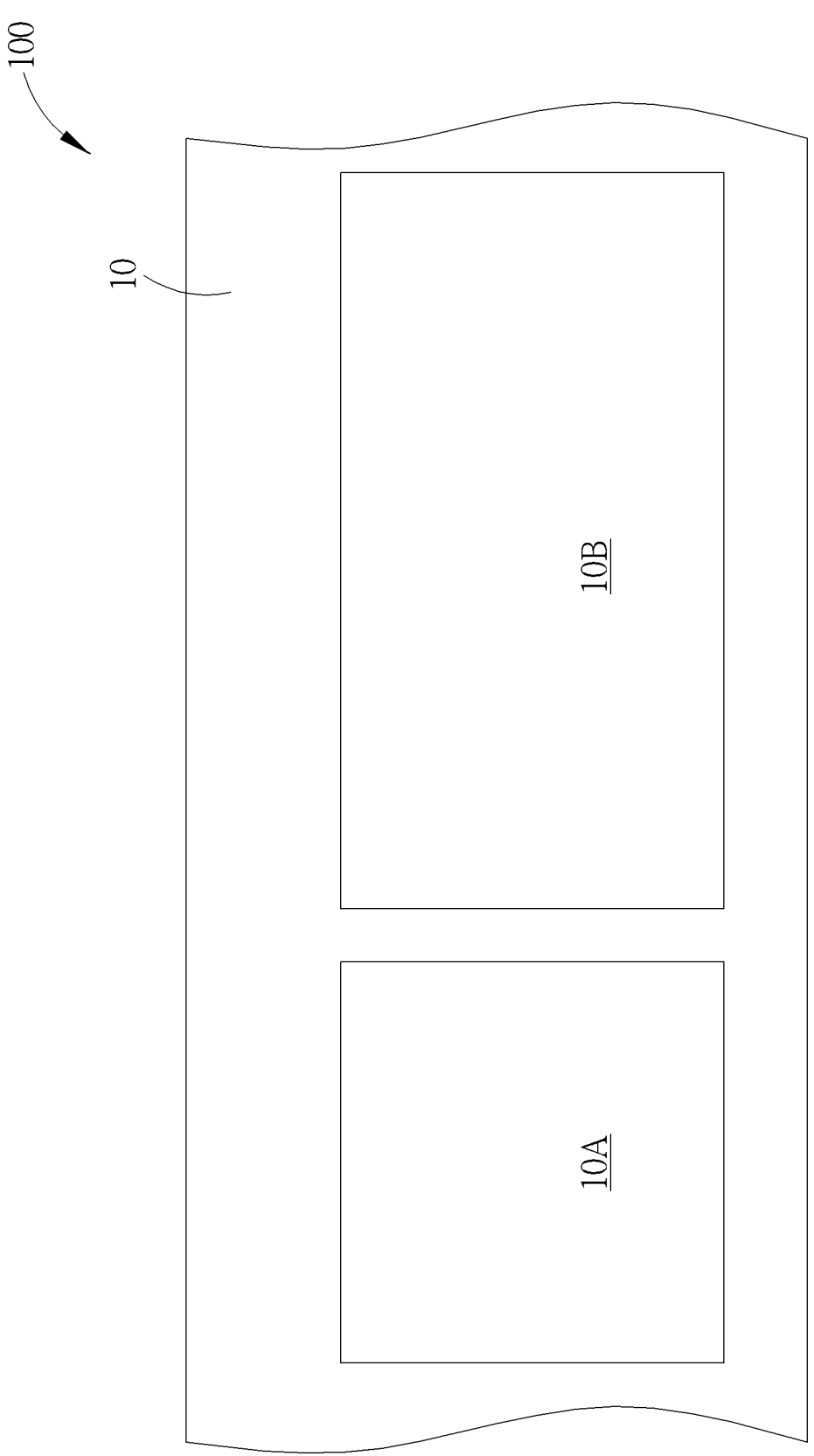
FIG. 1 is a schematic top plan view of a semiconductor structure according to one embodiment of the present invention.

FIG. 1 is a schematic top plan view of a semiconductor structure 100 according to one embodiment of the present invention. As shown in FIG. 1, the semiconductor structure 100 includes a substrate 10 having a peripheral region 10A and a memory region 10B defined thereon. The shapes and arrangements of the peripheral region 10A and the memory region 10B shown in FIG. 1 are only examples for the purpose of illustration, and should not be limitations to the present invention.

The peripheral region 10A may include peripheral circuits that control operations and input/out-put of the memory cells in the memory region 10B, such as drivers, buffers, amplifiers, and decoders, but are not limited thereto. The peripheral region 10A may also include circuits for repairing defective memory cells, such as fuse circuits. The memory region 10B may include an array of memory cells, for example, DRAM cells. The semiconductor devices of the peripheral circuits in the peripheral region 10A and the DRAM cells in the memory region 10B are integrally formed on the substrate 10 by a same manufacturing process.

FIG. 2 to FIG. 9 are schematic diagrams illustrating successive steps of a method for forming the semiconductor structure according to one embodiment of the present invention. The semiconductor structure shown in FIG. 2 to FIG. 9 may have a substrate and peripheral region and a memory region as shown in FIG. 1. The left portions of FIG. 2 to FIG. 9 are cross-sectional views of a first device region AA of a peripheral region of the semiconductor structure. The middle portions of FIG. 2 to FIG. 9 are cross-sectional views of a second device region BB of the peripheral region of the semiconductor structure. The right portions of FIG. 2 to FIG. 9 are cross-sectional views of a memory region CC of the semiconductor structure.

Figure 2:
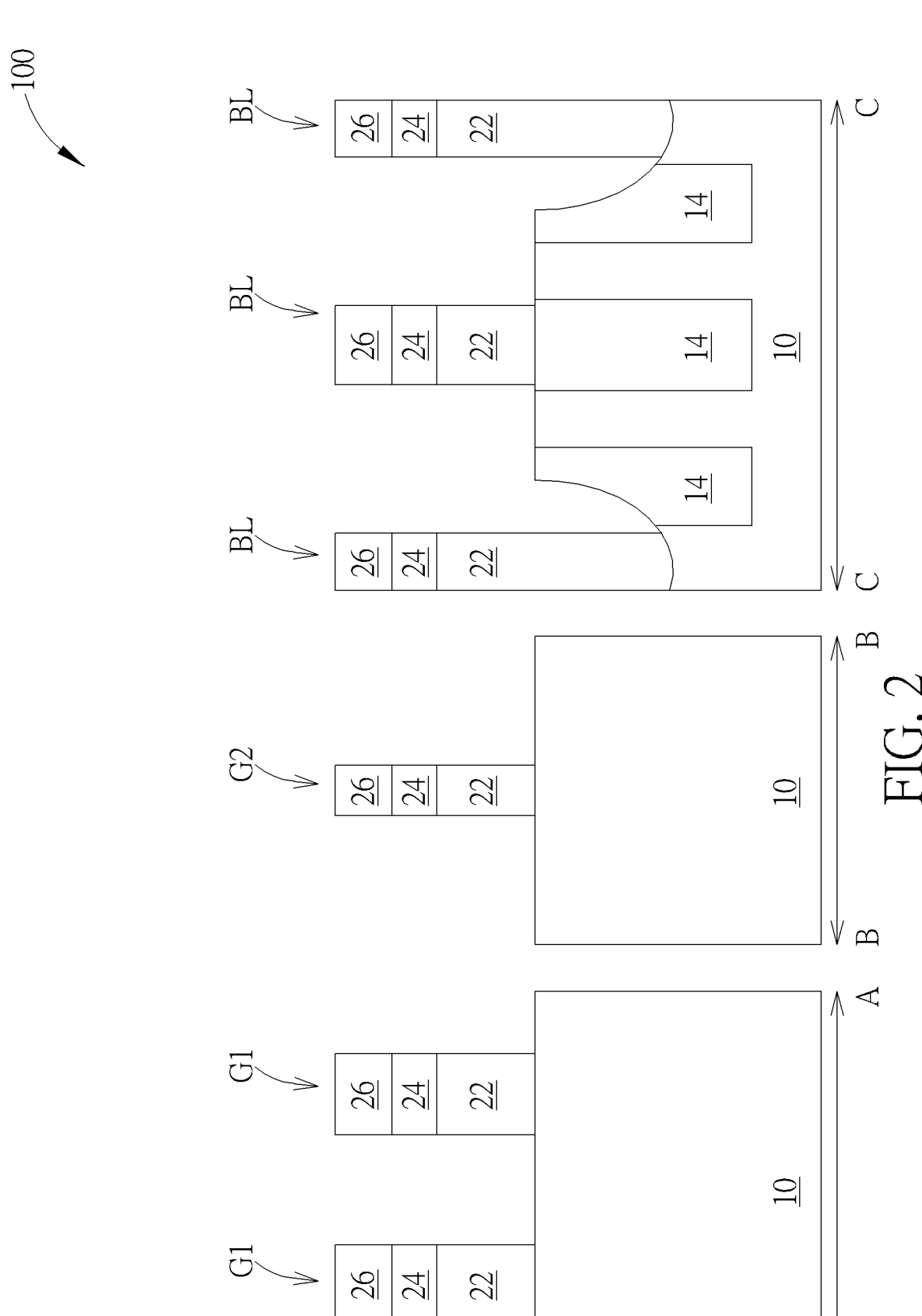
FIG. 2 to FIG. 9 are schematic diagrams illustrating successive steps of a method for forming the semiconductor structure according to one embodiment of the present invention.

Please refer to FIG. 2, a substrate 10 is provided. A plurality of isolation structures 14 such as shallow trench isolations (STI) may be formed in the substrate 10 to define a plurality of active regions of the semiconductor devices (not shown) in the peripheral region 10A of the substrate 10 and a plurality of active regions (not shown) of the memory cells (not shown) in the memory region 10B of the substrate 10. Furthermore, a plurality of buried word lines (not shown) may be formed in the substrate 10 and cut through the active regions (not shown) of the memory cells.

As shown in FIG. 2, two first gate structures G1, a second gate structure G2, and a plurality of bit lines BL are formed on the substrate 10 at the same time by the same manufacturing process. For example, a semiconductor material layer (not shown), a metal material layer (not shown), and a hard mask material layer (not shown) may be successively formed on the peripheral region and the memory region of the substrate 10. After that, a patterning process such as a photolithography-etching process may be performed to pattern the hard mask material layer, and a subsequent etching process using the patterned hard mask material layer as an etching mask may be performed to etch and remove the unnecessary portions of the semiconductor material layer and the metal material layer, such that the first gate structures G1, the second gate structure G2, and the bit lines BL may be obtained.

As shown in FIG. 2, the first gate structures G1, the second gate structure G2, and the bit lines BL respectively include a lower gate portion 22, an upper gate portion 24 on the lower gate portion 22, and a hard mask portion 26 on the upper gate portion 24. According to an embodiment, the lower gate portion 22 may include a semiconductor material, such as polysilicon. The upper gate portion 24 may include a conductive material, such as aluminum (Al), tungsten (W), copper (Cu), titanium (Ti), titanium aluminum alloy (TiAl), or other low-resistivity metal materials. The hard mask portion 26 may include silicon nitride (SiN), silicon oxynitride (SiON), silicon carbon nitride (SiCN), or other dielectric materials. A gate dielectric layer (not shown) may be disposed between the substrate 10 and the lower gate portions 22 of the first gate structures G1 and the second gate structures G2.

Figure 3:
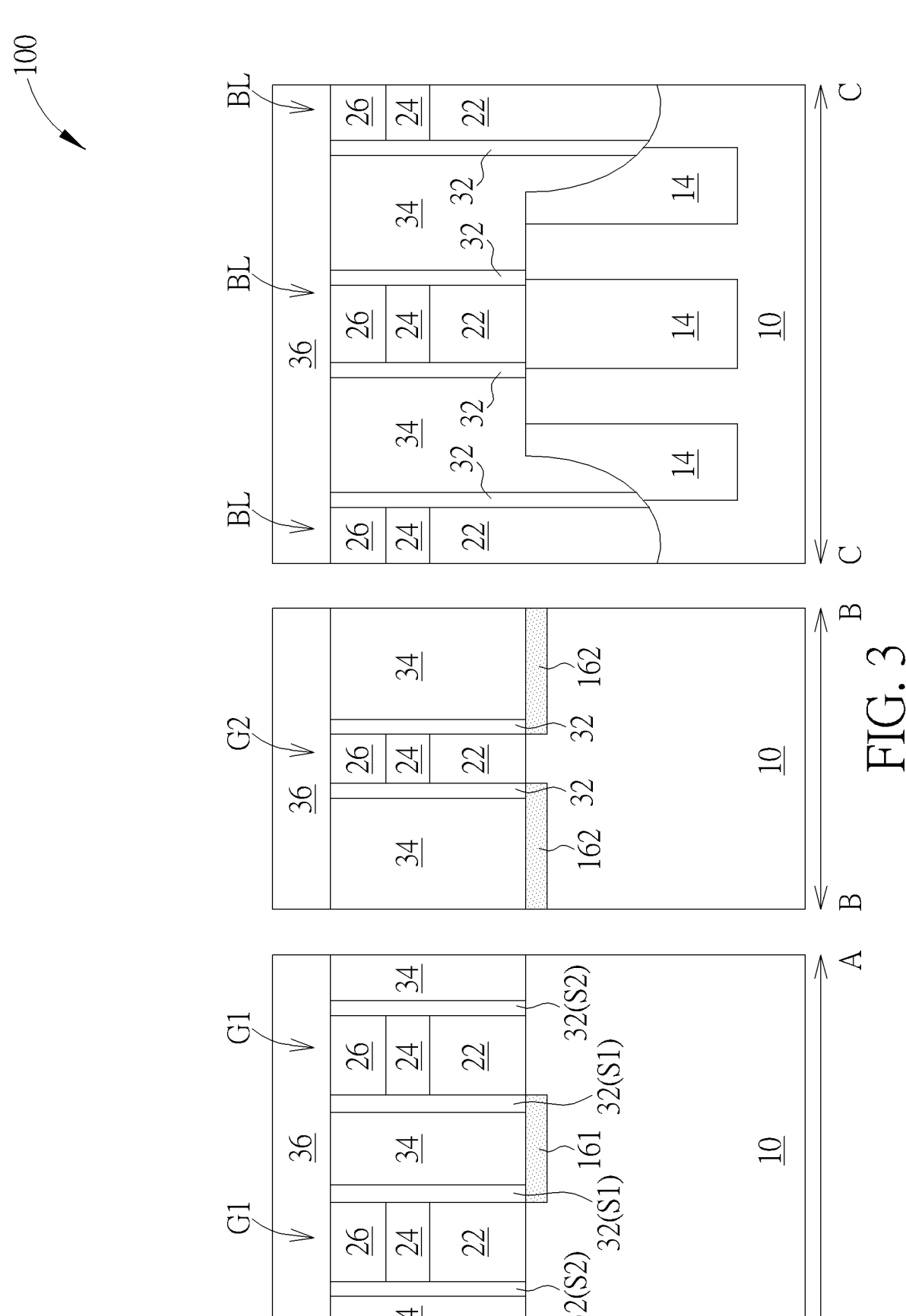

Please refer to FIG. 3. Subsequently, the spacers 32 may be formed on sidewalls of the first gate structures G1, the second gate structures G2, and the bit lines BL, and the doped region 161 in the substrate 10 between the first gate structures G1 and the doped regions 162 in the substrate 10 at two sides of the second gate structures G2 may be formed in the active regions (not shown) of the peripheral region 10A of the substrate 10. The positions of the doped region 161 and the doped regions 162 shown in FIG. 3 are only examples and should not be taken as limitations to the present invention. After that, a first dielectric layer 34 may be formed on the substrate 10, and a planarization process may be carried out to remove a portion of the first dielectric layer 34 until the top surfaces of the first gate structures G1, the second gate structure G2, and the bit lines BL are exposed. After that, a second dielectric layer 36 is formed on the first dielectric layer 34 and covering the exposed top surfaces of the first gate structures G1, the second gate structure G2, and the bit lines BL. According to an embodiment, the materials of the first dielectric layer 34 and the second dielectric layer 36 may include silicon oxide ($SiO_2$), silicon nitride (SiN), silicon oxynitride (SiON), silicon carbon nitride (SiCN), or other dielectric materials. According to an embodiment, the first dielectric layer 34 may include silicon oxide ($SiO_2$), and the second dielectric layer 36 may include silicon nitride (SiN), but is not limited thereto.

According to an embodiment, the spacers 32 may be formed by depositing at least a spacer material layer (not shown) on the substrate 10 and conformally covering the top surfaces and sidewalls of the first gate structures G1, the second gate structure G2, and the bit lines BL. An etching process such as a dry etching process may be performed to anisotropically etch and remove the unnecessary portions of the spacer material layer. The remaining portions of the spacer material layer on the sidewalls of the first gate structures G1, the second gate structure G2, and the bit lines BL become the spacers 32. The material of the spacers 32 may include silicon nitride (SiN), silicon oxynitride (SiON), silicon carbon nitride (SiCN), or other dielectric materials. According to an embodiment, the spacers 32 may respectively have a single-layered structure or a multi-layered structure. In the following description, the portions of the spacers 32 disposed on the inner sides of the first gate structures G1 (formed on the two adjacent sidewalls of the first gate structures G1 and between the two first gate structures G1) are also referred to as the inner spacers S1. The portions of the spacers 32 disposed on the outer sides of the first gate structures G1 (formed on the sidewalls of the first gate structures G1 opposite to the inner spacers S1) are referred to as the outer spacers S2.

Figure 4:
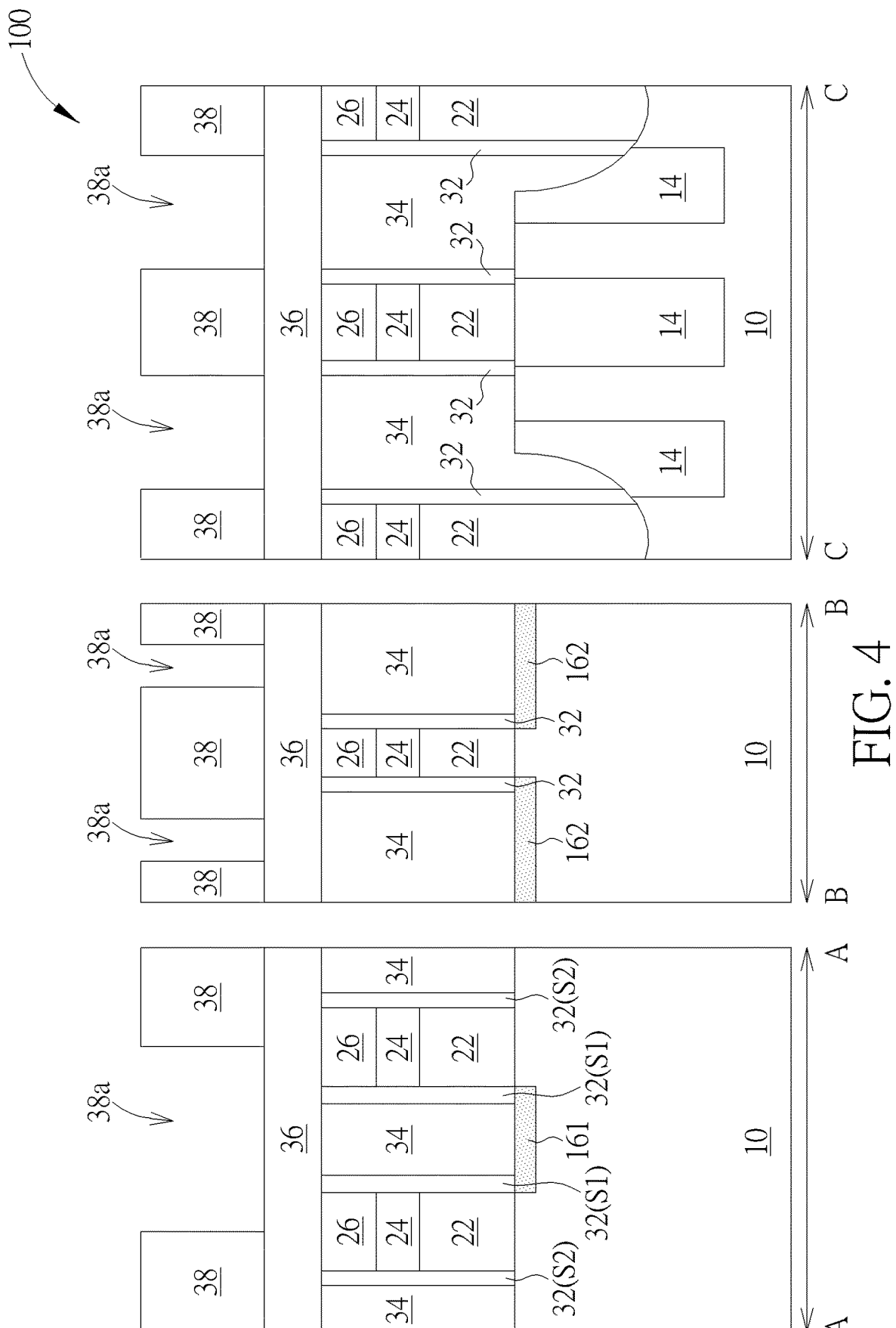

Please refer to FIG. 4. Subsequently, a patterned mask layer 38 may be formed on the second dielectric layer 36. The patterned mask layer 38 includes a plurality of mask openings 38a that expose predetermined portions of the second dielectric layer 36.

Figure 5:
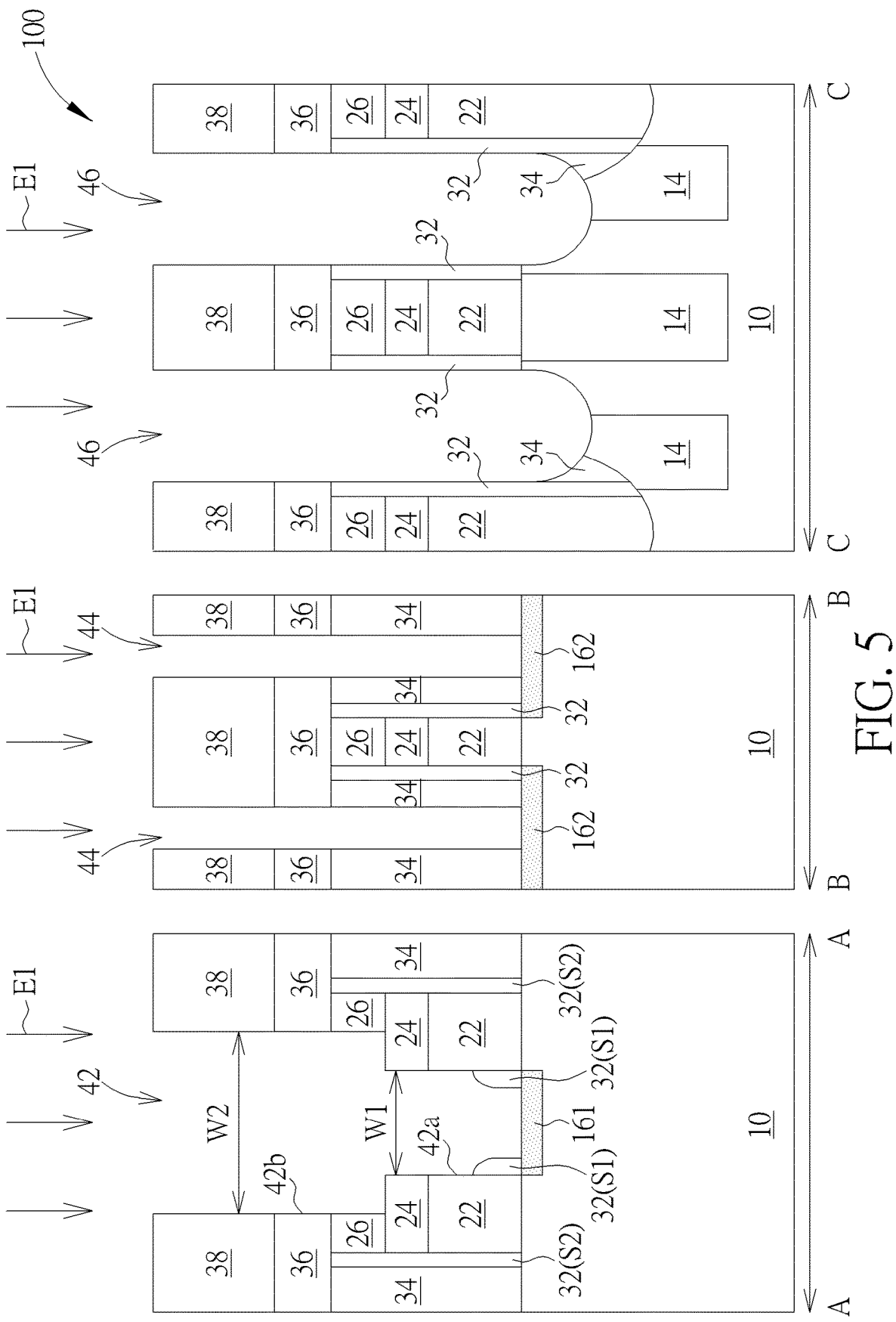

Please refer to FIG. 5. Subsequently, a contact etching process E1 such as a dry etching process is performed, using the patterned mask layer 38 as an etching mask to etch and remove the exposed portions of the second dielectric layer 36 and the first dielectric layer 34, thereby forming the first contact opening 42, the second contact openings 44, and the storage node contact openings 46. The first contact opening 42 is between the two first gate structures G1 and through the second dielectric layer 36 and the first dielectric layer 34 to expose portions of the doped region 161 in the substrate 10. The second contact openings 44 are at two sides of the second gate structure G2 and through the second dielectric layer 36 and the first dielectric layer 34 to expose portions of the doped region 162 at two sides of the second gate structure G2. The storage node contact openings 46 are between the bit lines BL and through the second dielectric layer 36 and the first dielectric layer 34 to expose portions of the active regions (not shown) of the memory cells.

According to an embodiment, the hard mask portions 26 of the first gate structures G1 may be partially removed during the contact etching process E1. Accordingly, the first contact opening 42 may have a T-shaped cross-sectional profile. As shown in FIG. 5, the first contact opening 42 has a first portion 42a having a first width W1 and a second portion 42b over the first portion 42a and having a second width W2. The first width W1 is smaller than the second width W2. The first portion 42a may expose the substrate 10 between the first gate structures G1. The second portion 42b may expose top surfaces of the upper gate portions 24 and sidewalls of the hard mask portions 26 of the first gate structures G1.

According to an embodiment, during the contact etching process E1, the inner spacers S1 between the first gate structures G1 may be partially removed. Therefore, the sidewalls of the lower gate portions 22 and the sidewalls of the upper gate portions 24 of the first gate structures G1 are exposed from the first portion 42a of the first contact opening 42.

Figure 6:
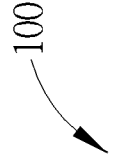

Please refer to FIG. 6. After removing the patterned mask layer 38, lower gate portions 45 may be selectively formed on the exposed active regions (not shown) of the memory cells and fill the lower portions of the storage node contact openings 46. Subsequently, a conductive layer 52 may be formed on the second dielectric layer 36 and completely fills the first contact opening 42, the second contact openings 44, and the storage node contact openings 46. The conductive layer 52 may include a metal, for example, tungsten (W).

Figure 7:
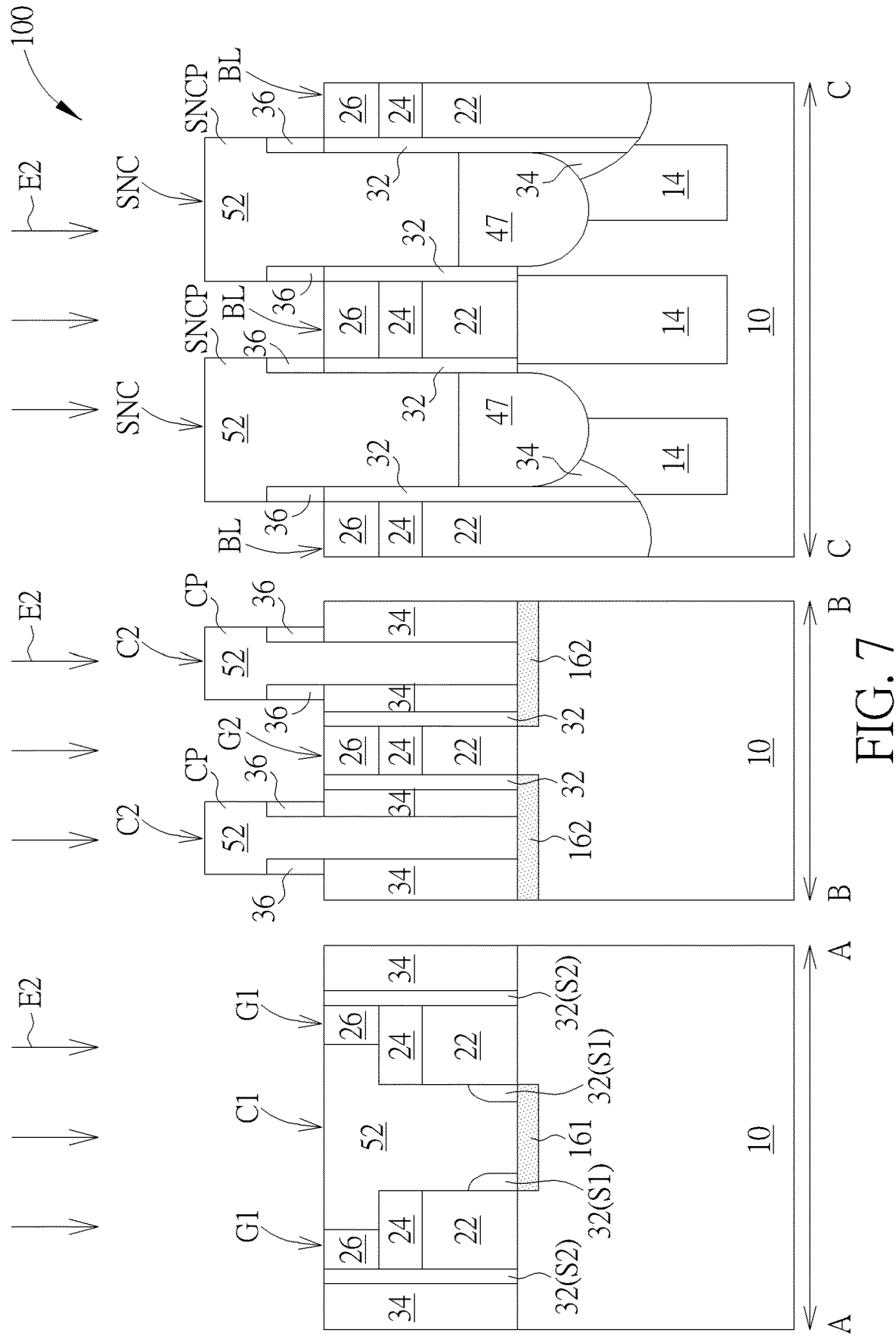

Subsequently, as shown in FIG. 7, after forming another patterned mask layer (not shown) on the conductive layer 52 to cover portions of the conductive layer 52, a recessing process E2 may be performed, using the patterned mask layer (not shown) as an etching mask to etch and pattern the conductive layer 52 and also remove the exposed portions of the second dielectric layer 36, thereby forming the first contact structure C1 in the first contact opening 42, the second contact structures C2 respectively in the second contact openings 44 and having a pad portions CP outside the second contact openings 44, the storage node contacts SNC respectively in the storage node contact openings 46 and having a pad portions SNCP outside the storage node contact openings 46. It is noteworthy that the first contact structure C1, the second contact structures C2, and the storage node contacts SNC respectively have a one-piece configuration.

According to an embodiment, after the recessing process E2, the conductive layer 52 in the first contact opening 42 is recessed to have a top surface substantially flush with the top surfaces of the hard mask portion 26, the top surfaces of the outer spacers S2, and the top surfaces of the first dielectric layer 34 after the recessing process E2.

Figure 8:
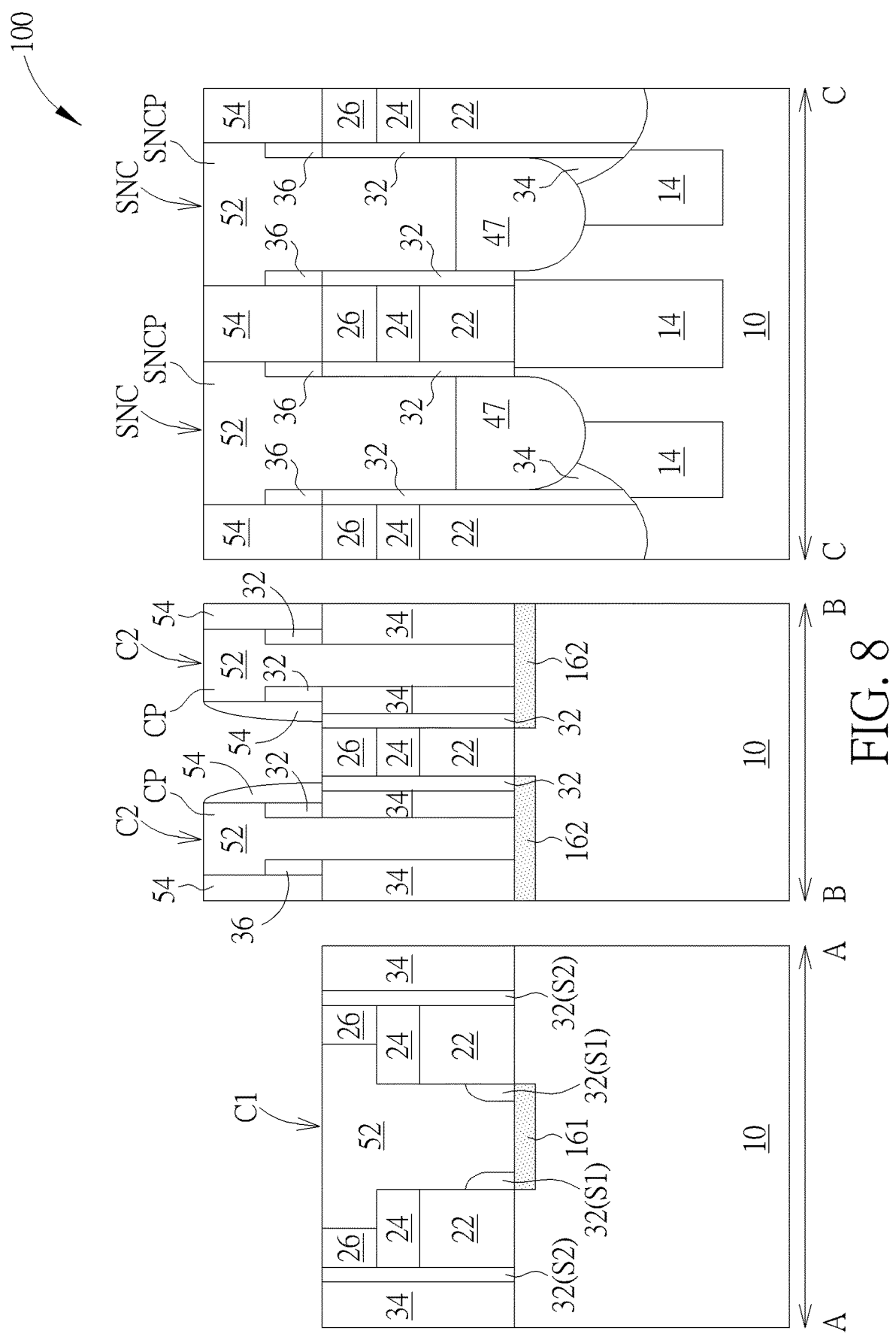

Please refer to FIG. 8. Subsequently, a passivation layer 54 may be formed on the first dielectric layer 34, and an etching process (not shown) such as a dry etching process may be performed to remove a portion of the passivation layer 54 until the top surface of the first contact structure C1, the top surfaces of the pad portions CP of the second contact structure C2, and the top surfaces of the pad portions SNCP of the storage node contacts SNC are exposed. According to an embodiment, a remaining portion of the passivation layer 54 may form spacers on sidewalls of the pad portions CP and the portions of the second dielectric layer 36 under the pad portions CP. Another remaining portion of the passivation layer 54 may completely fill the spaces between the pad portions SNCP. According to an embodiment, the passivation layer 54 may include silicon nitride (SiN).

Figure 9:
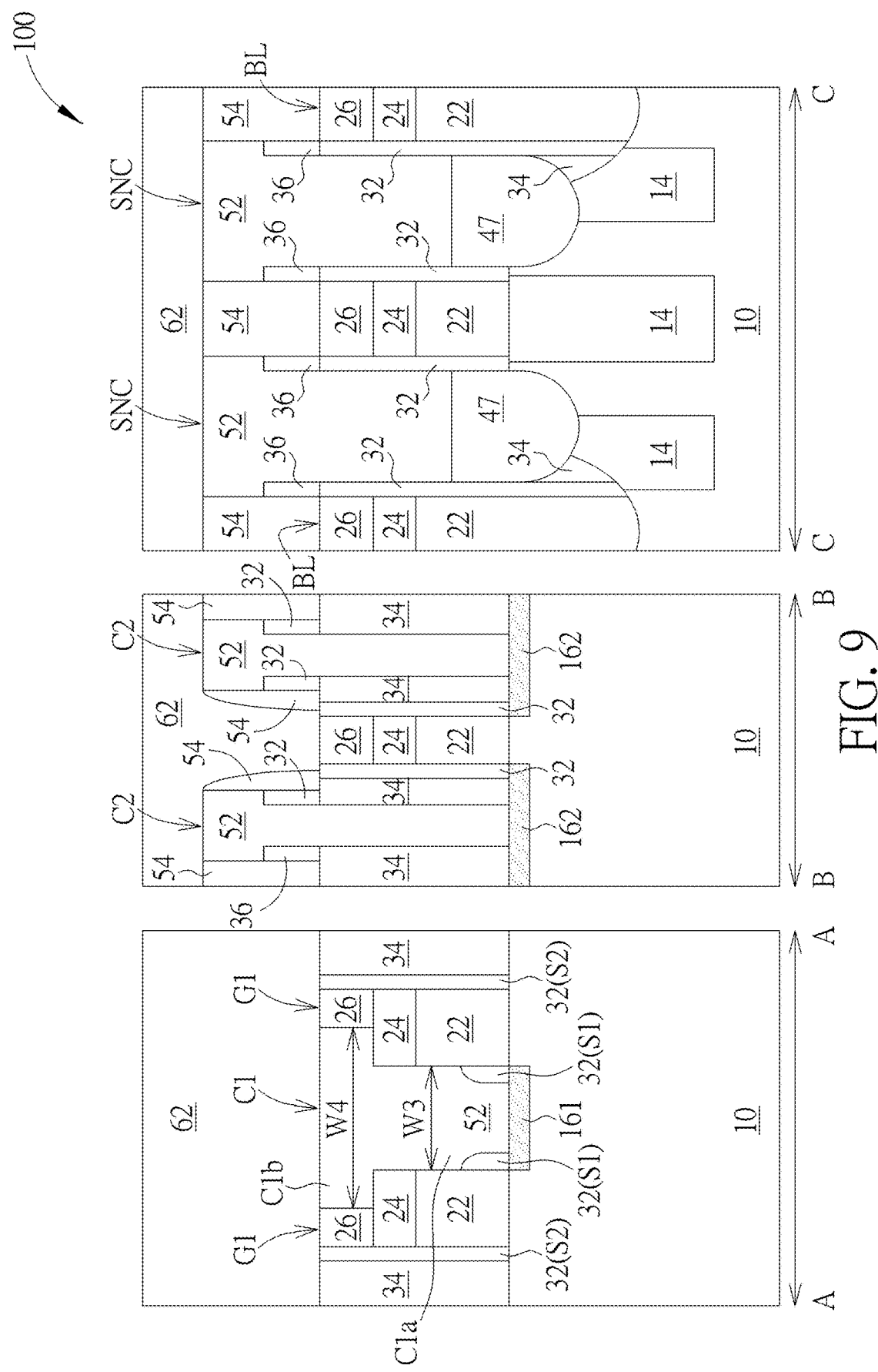

Please refer to FIG. 9. Subsequently, an interlayer dielectric layer 62 is formed on the first contact structure C1, the pad portions CP, and the pad portions SNCP. The interlayer dielectric layer 62 also fills the space between the pad portions CP. The materials of the interlayer dielectric layer 62 may include silicon oxide ($SiO_2$), silicon nitride (SiN), silicon oxynitride (SiON), silicon carbon nitride (SiCN), or other dielectric materials. In later process steps (not shown), after planarizing the interlayer dielectric layer 62, a plurality of interconnect structure (not shown) may be formed in the interlayer dielectric layer 62 to electrically connect to the first contact structure C1, the pad portions CP of the second contact structures C2, and the pad portions SNCP of the storage node contacts SNC.

In light of the above and as shown in FIG. 9, the semiconductor structure 100 provided by the present invention includes a substrate 10 having a peripheral region 10A and a memory region 10B defined thereon. A first contact structure C1 is disposed on the peripheral region 10A of the substrate 10. The first contact structure C1 has a one-piece configuration and has a T-shaped cross-sectional profile having a first portion C1a directly contacting the substrate 10 and a second portion C1b disposed on the first portion C1a. A width W4 of the second portion C1b is larger than a width W3 of the first portion C1a.

Two first gate structures G1 are disposed on the substrate 10 and at two sides of the first contact structure C1. Each of the first gate structures G1 includes a lower gate portion 22 on the substrate 10, an upper gate portion 24 on the lower gate portion 22, and a hard mask portion 26 on the upper gate portion 24. The lower gate portion 22 and the upper gate portion 24 altogether are also referred to as the electrode portion of the first gate structure G1. As shown in FIG. 9, a top surface of the first contact structure C1 (that is, the top surface of the second portion C1b of the first contact structure C1) is flush with the top surfaces of the first gate structures G1 (that is, the top surfaces of the hard mask portions 26 of the first gate structures G1).

The first portion C1a of the first contact structure C1 directly contacts the sidewalls of the lower gate portions 22 and the sidewalls of the upper gate portions 24 of the first gate structures G1. The second portion C1b of the first contact structure C1 directly contacts top surfaces of the upper gate portions 24 and sidewall of the hard mask portions 26 of the first gate structures G1. The first contact structure C1 is a share contact that is electrically connected to the two first gate structures G1 and the substrate 10 between the two first gate structures G1. According to an embodiment, the first contact structure C1 may be used to connect the two first gate structures G1 and the shared source/drain region (the doped region 161) between the two first gate structures G1 in order to reduce the area of the peripheral circuits. For example, the first contact structure C1 provided by the present invention may be used in a fuse circuit in the peripheral region 10A which is for repairing defective memory cells in the memory region 10B.

Two inner spacers S1 may be disposed on the substrate 10 and sandwiched between the first portion C1a of the first contact structure C1 and the first gate structures G1. The top surfaces of the inner spacers S1 are lower than top surfaces of the upper gate portions 24 of the first gate structures G1. In other words, the top surfaces of the inner spacers S1 are lower than top surfaces of electrode portion of the first gate structures G1

Two outer spacers S2 may be disposed on the substrate 10 and on the sidewalls of the first gate structures G1 opposite to the inner spacers S1. The sidewalls of the lower gate portions 22 and the sidewalls of the upper gate portions 24 of the first gate structures G1 opposite to the inner spacers S1 may be fully covered by the two outer spacers S2. The sidewalls of the hard mask portions 26 of the first gate structures G1 opposite to the first contact structure C1 is at least partially covered by the two outer spacers S2.

A second gate structure G2 may be disposed on the peripheral region 10A of the substrate 10, and two second contact structures C2 may be disposed on the substrate 10 and at two sides of the second gate structure G2. The second contact structures C2 respectively have a lower portion directly contacting the substrate 10 and surrounded by the first dielectric layer 34 and an upper portion disposed on the lower portion and surrounded by a portion of the second dielectric layer 36. A pad portion CP of the second contact structure C2 extends laterally to cover the top surface of the portion of the second dielectric layer 36 surrounding the upper portion of the second contact structure C2.

A plurality of bit lines BL may be disposed on the memory region 10B of the substrate 10, and a plurality of storage node contact SNC may be disposed on the substrate 10 and between the bit lines BL. The storage node contacts SNC respectively have a lower portion directly contacting the substrate 10 and surrounded by the first dielectric layer 34 and an upper portion disposed on the lower portion and surrounded by a portion of the second dielectric layer 36. A pad portion SNCP of the storage node contact SNC extends laterally to cover the top surface of the portion of the second dielectric layer 36 surrounding the upper portion of the storage node contacts SNC.

The top surfaces of the pad portions CP and the top surfaces of the pad portions SNCP are substantially flush with each other, and are at a position higher than the top surface of the first contact structure C1 (the top surface of the second portion 42b).

Figure 10:
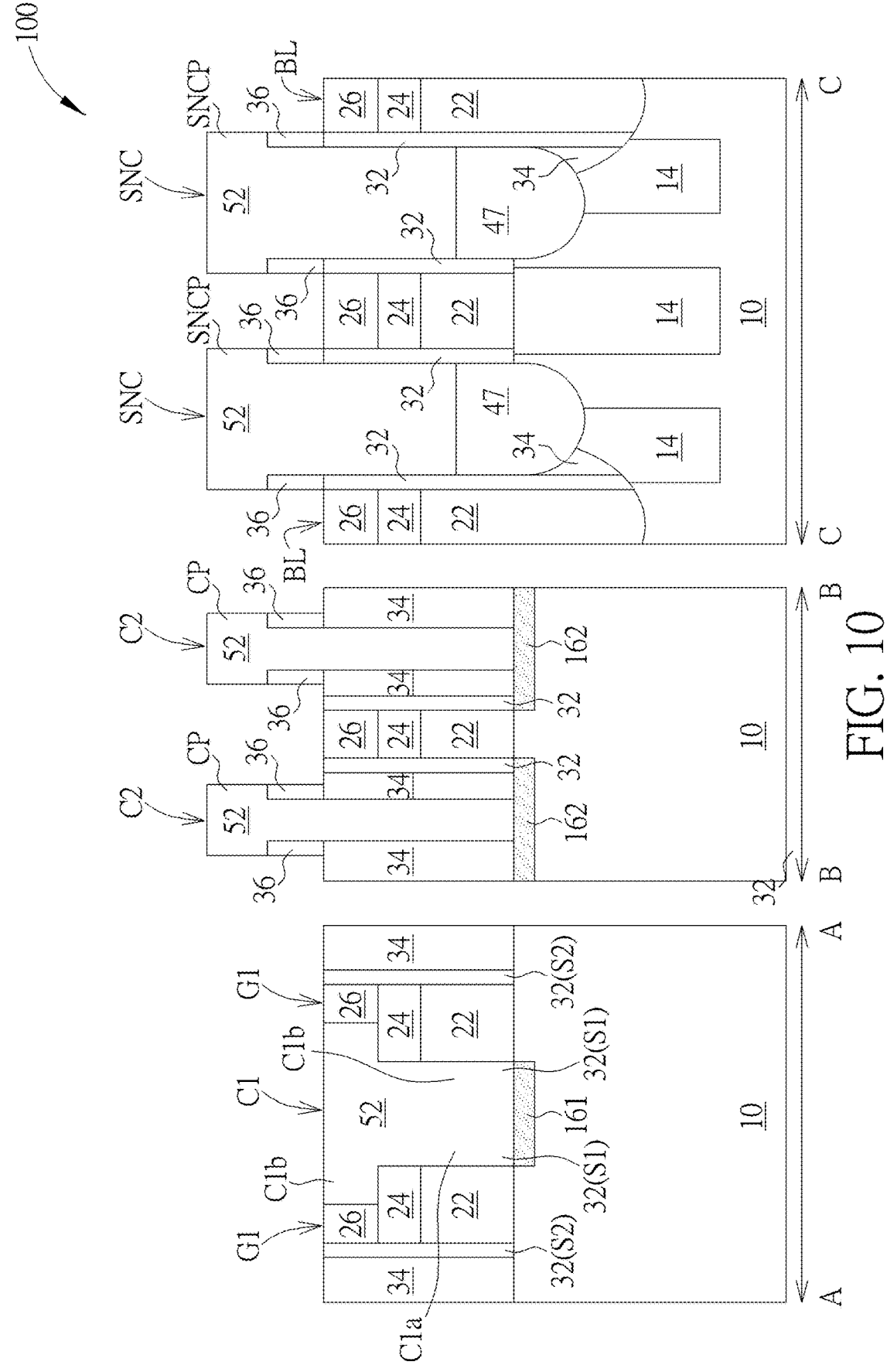
FIG. 10 is a schematic diagram illustrating a cross-sectional view of a semiconductor structure according to another embodiment of the present invention.

Please refer to FIG. 10, which is a schematic diagram illustrating a cross-sectional view of a semiconductor structure according to another embodiment of the present invention. To simplify the description, identical components in the embodiment shown in FIG. 10 and the embodiment shown in 7 are marked with identical symbols. A difference between the embodiment shown in FIG. 10 and the embodiment shown in 7 is that, the inner spacers S1 may be completely removed during the contact etching process E1. Therefore, sidewalls of the lowest portions of the first gate structures G1, that is, the lowest portions of the lower gate portions 22 may be fully contacted by the first portion C1a of the first contact structure C1.

In conclusion, the present invention provides a semiconductor structure having different types of contact structures (the first contact structure C1 and the second contact structure C2) which may be conveniently formed by the manufacturing process for forming the storage node contacts, and may be used to form different peripheral circuits in the peripheral region of the semiconductor structure. For example, the first contact structure may be a share contact to electrically connect two gate structures and a shared source/drain region between the two gate structures, while the second contact structure may be used to electrically connect a source/drain region of a transistor. The manufacturing process of the semiconductor structure provided by the present invention may be simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate comprising a first region and a second region;
two first gate structures disposed on the first region and a bit line disposed on the second region, wherein each of the first gate structures comprises a first electrode portion and a first hard mask portion disposed on the first electrode portion, the bit line comprises a second electrode portion and a second hard mask portion disposed on the second electrode portion, wherein an inner sidewall of the first hard mask portion locates on a top surface of the first electrode portion and the top surface of the first electrode portion is coplanar with a top surface of the second electrode portion;
a first contact structure disposed on the substrate and between the two first gate structures, wherein the first contact structure has a T-shaped cross-sectional profile having a first portion contacting the substrate and a second portion disposed on the first portion, wherein a width of the second portion is larger than a width of the first portion, wherein a top surface of the second portion of the first contact structure is not higher than top surfaces of the hard mask portions of the two first gate structures, a bottom surface of the first portion is in direct contact with the substrate;
two second contact structures disposed on the substrate at two sides of the-bit line, wherein top surfaces of the two second contact structures are higher than the top surface of the second portion of the first contact structure, bottom surfaces of the two second contact structures are in direct contact with the substrate and lower than the bottom surface of the first portion of the first contact structure;
a passivation layer disposed on the second hard mask portion of the bit line, wherein the two second contact structures directly contact sidewalls of the passivation layer; and
an interlayer dielectric layer disposed on the two first gate structures, the first contact structure, the two second contact structures, and the passivation layer.

2. The semiconductor structure according to claim 1, wherein the first electrode portions of the two first gate structures respectively comprise:
a lower gate portion; and
an upper gate portion on the lower gate portion, wherein the first portion of the first contact structure directly contacts an inner sidewall of the lower gate portion and an inner sidewall of the upper gate portion.

3. The semiconductor structure according to claim 2, wherein the second portion of the first contact structure directly contacts topmost surfaces of the upper gate portions of the two first gate structures, respectively.

4. The semiconductor structure according to claim 2, further comprises:

two inner spacers disposed on the substrate and sand-wiched between the first portion of the first contact structure and the two first gate structures, wherein topmost surfaces of the two inner spacers are lower than topmost surfaces of the upper gate portions of the two first gate structures.

5. The semiconductor structure according to claim 4, further comprises:

two outer spacers disposed on two sides of the two first gate structures opposite to the inner spacers, wherein an outer sidewall of the lower gate portion and an outer sidewall of the upper gate portion of each of the two first gate structures are fully covered by one of the two outer spacers, and an outer sidewall of the hard mask portions of each of the two first gate structures is at least partially covered by one of the two outer spacers.

6. The semiconductor structure according to claim 1, wherein the first contact structure has a one-piece configuration.

7. The semiconductor structure according to claim 1, wherein the interlayer dielectric layer is in direct contact with the top surfaces of the hard mask portions of the two first gate structures, the top surface of the second portion of the first contact structure, the top surfaces of the two second contact structures, and a top surface of the passivation layer.

\* \* \* \* \*